(12) United States Patent
Wu et al.

(10) Patent No.: US 7,319,417 B2
(45) Date of Patent: Jan. 15, 2008

(54) COMPRESSION USING MULTIPLE MARKOV CHAIN MODELING

(75) Inventors: Xiaolin X. Wu, Ancaster (CA);
Yuanhao Sun, Shanghai (CN);
Boon-Lock Yeo, Los Altos Hills, CA (US); Lv Lv, Shanghai (CN); Fenglin Yu, Shangai (CN)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/282,145

(22) Filed: Nov. 18, 2005

(65) Prior Publication Data

US 2007/0115148 A1 May 24, 2007

(51) Int. Cl.
*H03M 7/00* (2006.01)
(52) U.S. Cl. .................. 341/107; 341/51; 341/106; 281/239; 281/247
(58) Field of Classification Search .............. 341/107
See application file for complete search history.

(56) References Cited

U.S. PATENT DOCUMENTS

| | | | | |
|---|---|---|---|---|
| 5,023,611 A | * | 6/1991 | Chamzas et al. | 341/51 |
| 5,025,258 A | * | 6/1991 | Duttweiler | 341/107 |
| 5,298,896 A | * | 3/1994 | Lei et al. | 341/51 |
| 5,414,423 A | * | 5/1995 | Pennebaker | 341/107 |
| 5,689,589 A | * | 11/1997 | Gormish et al. | 382/239 |
| 6,516,305 B1 | * | 2/2003 | Fraser | 706/8 |
| 6,606,037 B2 | * | 8/2003 | Ekstrand et al. | 341/50 |
| 6,850,175 B1 | * | 2/2005 | Bossen | 341/107 |

FOREIGN PATENT DOCUMENTS

EP   1387265 A1   2/2004

OTHER PUBLICATIONS

Bloom: Solving the Problems of Context Modeling, CA Inst. of Tech., 11 pages, unknown date.
Witten, et al.: Arithmetic Coding for Data Compression, Communications of the ACM, Jun. 1987, vol. 30, No. 6, pp. 520-540.
Beszedes, et al.: Survey of Code-Size Reduction Methods, ACM Computing Surveys, vol. 35, No. 3, Sep. 2003, pp. 223-267.
Drinic, et al.: PPMexe: PPM for Compresssing Software, Proceedings of the Data Compression Conference (DDC '02), IEEE, 5 pages, no date.
Yuan Xie et al: "A code decompression architecture for VLIW processors". Microarchitecture, 2001. Micro-34. Proceedings. 34th ACM/IEEE International Symposium on Dec. 1-5, 2001. Piscataway. NJ, USA, IEEE, Dec. 1, 2001, pp. 66-75.
Drinic M et al: "PPMexe: PPM for compressing sotware" Proceedings DCC2002. Data Compression Conference IEEE Comput. Soc Los Alamitos, CA, USA, 2002, pp. 192-201.
Lekatsas H et al: "Code compression for embedded systems" Design Automation Conference, 1998. Proceedings San Fancisco, CA, USA. Jun. 15-19, 1998, New York, NY, USA, IEEE, US, Jun. 15, 1998 (Jun. 15, 1998), pp. 516-521.

(Continued)

*Primary Examiner*—Khai M. Nguyen

(57) ABSTRACT

An input tangled sequence such as an instruction stream is compressed by modeling the sequence into multiple Markov chains to simultaneously capture and exploit the correlations among and within subsequences that are mingled in the input tangled sequence. The multiple Markov chains may be combined to drive an entropy coder.

28 Claims, 11 Drawing Sheets

OTHER PUBLICATIONS

Fraser C W: "Automatic Inferfncf of Models for Statistical Code Compression" ACM Sigplan Notices, ACM, Associations for Computing Machinery, New York, NY, US, vol. 34, No. 5, May 1, 1999, pp. 242-246.

Beszedes A et al: "Survey of code-size reduction methods" ACM Computing Surveys ACM USA, vol. 35, No. 3, Sep. 2003 (Sep. 2003), pp. 223-267.

PCT Search Report dated Apr. 3, 2007.

* cited by examiner

| BINARY CODE | ASSEMBLY |
|---|---|
| INSTRUCTION: 0x8b 0xc8<br><br>INSTRUCTION: 0xe8 0x01 0xe7 0x1e 0x00 | mov ecx, eax<br><br>call 0x101eec51 |
| INSTRUCTION: 0x8b 0x4d 0xf4<br><br>INSTRUCTION: 0x89 0x46 0x18 | mov ecx, DWORD PTR [ebp-12]<br><br>mov DWORD PTR [esi+24], eax |
| INSTRUCTION: 0x8b 0x08<br><br>INSTRUCTION: 0x89 0x4d 0xdc | mov ecx, DWORD PTR [eax]<br><br>mov DWORD PTR [ebp-36], ecx |

FIG. 3

| BINARY CODE | | | ASSEMBLY |
|---|---|---|---|
| OPCODE | MOD R/W | DISPLACEMENT AND IMMEDIATE | |
| INSTRUCTION: 0x8b | 0xec | | mov ebp, esp |
| INSTRUCTION: 0x8b | 0x35 | 0x48 0x33 0x62 0x00 | mov esi, ds:0x00623348 |
| INSTRUCTION: 0x8b | 0x35 | 0x18 0x39 0x62 0x00 | mov esi,ds:0x00623018 |

FIG. 5

$$(X_1, X_2, \ldots, X_{i_1})$$

$$(X_{i_1+1}, X_{i_1+2}, \ldots, X_{i_2})$$

...

$$(X_{i_k+1}, X_{i_k+2}, \ldots, X_{i_{k+1}})$$

...

$$(X_{i_n+1}, X_{i_n+2}, \ldots, X_{i_N})$$

FIG. 7

| Opcode | Mod | Operand | Operation |
|--------|-----|---------|-----------|
| 8D | 4D | 10 | lea ecx,[ebp+10h] |
| 50 | | | push eax |
| 89 | 45 | 08 | mov dword ptr [ebp+8],eax |
| 85 | C0 | | test eax,eax |

FIG. 8

COMPRESSION USING MULTIPLE MARKOV CHAIN MODELING

FIELD OF THE INVENTION

This disclosure relates to compression of executable code and in particular to modeling intra-instruction and inter-instruction correlations into multiple Markov chains for compression of executable code.

BACKGROUND

Compression reduces the size of a set of data by its equivalent representation in another form. Data compression refers to the process of reducing the amount of data needed to represent information. Data compression techniques reduce the costs for information storage and transmission and are used in many applications, ranging from simple file size reduction to speech and video encoding.

Most commonly used compression methods are either dictionary-based or statistical. Statistical methods combine entropy coding with modeling techniques. Typically, statistical methods are used for compressing executable code. Each input symbol in a sequence of input symbols is represented by a variable length code to produce a stream of codes representing the input symbols that has fewer bits than the sequence of input symbols. Each input symbol has a certain probability value associated with its frequency of occurrence in the sequence of input symbols. In order to reduce the number of bits, most statistical compression methods encode the symbols with the highest probability of occurrence with codes having the least number of bits.

Typically, statistical compression methods include a model and a coder. The model includes statistical information obtained from the sequence of input symbols. In the simplest case, for example, the Markov model, the model provides probability values for the input symbols based on their frequency of appearance in the sequence of input symbols. The coder produces an encoded sequence of codes from the sequence of input symbols and the probability values provided by the model.

Executable code is a linear sequence of instructions. For a given machine architecture, an instruction has a specific format, generally including three fields: an opcode, an addressing mode and an operand. Statistical compression of executable code differs from statistical compression of regular data because of statistical dependencies specific to the structures of executable code. Statistical dependencies exist between the fields of an instruction, which is called intra-instruction correlation. Moreover, there are also strong statistical dependencies between instructions, called inter-instruction correlation, because a machine language is characterized by its syntax, semantics and modularity. The intra-instruction and inter-instruction correlations are tangled with each other in complicated ways.

Typically, in order to utilize the statistical dependencies between instructions to achieve a high compression ratio, there is a rigid mechanical separation of opcodes and the rest of an executable program. However, this separation methodology is suboptimal because it prevents the exploitation of some intra-instruction correlations. But on the other hand, not extracting the opcodes and compressing an executable program as one sequence obscures the inter-instruction correlation, also compromising compression performance.

Both intra-instruction and inter-instruction correlations may be exploited by combining the opcode of the instruction with the addressing mode of the instruction, treating them as an extended opcode, and then separating and compressing the sequence of extended opcodes for the instructions. But this alternative method is also problematic because it artificially creates a sequential coupling between the opcode of the current instruction and the addressing mode of the previous instruction, even though these two entities have a very weak correlation. As a result, sequential compression of the extended opcodes does not achieve a high compression ratio.

BRIEF DESCRIPTION OF THE DRAWINGS

Features of embodiments of the claimed subject matter will become apparent as the following detailed description proceeds, and upon reference to the drawings, in which like numerals depict like parts, and in which:

FIG. 3 illustrates examples of three sets of two consecutive instructions with the first instruction in each set being a mov instruction having an opcode 0x8B;

FIG. 5 illustrates examples of mov instructions having opcode 0x8B followed by a ModR/M byte.

FIG. 7 illustrates an opcode subsequence in a sequence of instructions in an executable program;

FIG. 8 illustrates an example of a sequence of instructions in executable code (program) that include statistically irrelevant symbols.

DETAILED DESCRIPTION

In the following description, numerous specific details are set forth. However, embodiments of the invention may be practiced without these specific details. In other instances, well-known circuits, structures and techniques have not been shown in detail in order not to obscure the understanding of this description.

In one embodiment, a finite context model also referred to as a Markov model simultaneously captures and exploits both inter-instruction and intra-instruction correlations (statistical redundancies that are mingled in an executable program). This Markov modeling method provides superior compression performance over prior art models.

Figure 1:
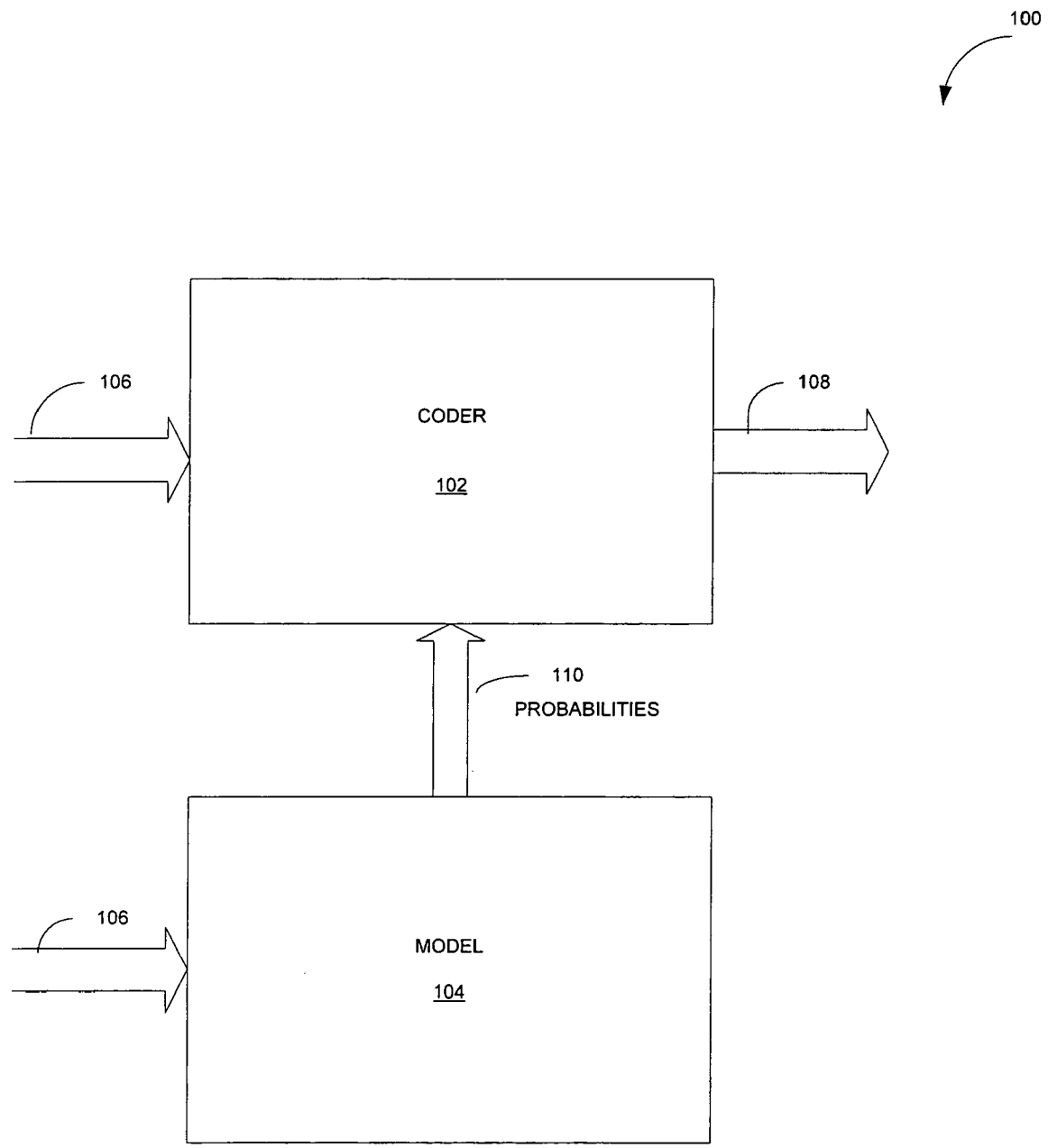
FIG. 1 is a block diagram of an embodiment of a compressor for compressing executable code (a stream of program instructions in an executable program or file) according to the principles of the present invention.

FIG. 1 is a block diagram of an embodiment of a compressor 100 for compressing executable code (a stream of program instructions in an executable program or file) according to the principles of the present invention. The compressor 100 includes a coder 102 and a model 104. The executable code to be compressed is input to both the coder 102 and the model 104 in the form of a sequence of symbols 106. The symbol is a generic term having a different meaning in different instruction sets. The model provides a probability estimate (probabilities) 110 for each symbol to the coder 102 so that the coder 102 can encode the symbol with the maximum compression to provide a compressed sequence of codes 108 that is shorter than the input sequence of symbols 106.

The compressor 110 uses a statistical method of data compression by encoding symbols in the input sequence of symbols 106, one at a time into variable length output codes. The length of the output code varies dependent on the probability (frequency) of the symbol, with low probability symbols being encoded with more bits than high probability symbols.

The model 104 builds multiple Markov chains based on the sequence of symbols 106, that is, the model 104 discovers subsequences of symbols in which symbols are strongly related and then estimates the probability of the symbol in its subsequence.

The coder 102 may be an entropy coder such as an arithmetic coder that replaces a subsequence of symbols 106 with a single floating point number (less than 1 and greater or equal to 0) dependent on the probabilities provided by the model 104. Entropy coders are well-known to those skilled in the art and beyond the scope of the present invention.

The number of bits used to encode an input symbol is dependent on the predicted probability provided by the model 104. In an embodiment in which each symbol is 8-bits, there are ($2^8$) possible values for the symbol and each value occurs with a predicted probability of P (1/256). The number of bits used to encode the symbol in the sequence of codes is found by computing $-\log_2$ (Predicted probability) for the predicted probability received from the model 104. With each symbol given an equal probability, the predicted probability is 1/256 which requires an 8-bit code to encode the input symbol. If one of the symbols occurs 25% of the time, the symbol can be represented by 2 bits ($-\log_2(0.25)$) so the 8-bit symbol is compressed by representing it by a 2-bit code. Thus, the predicted probability computed by the model determines the compression ratio provided by the compressor 100. In an executable program, a sequence of opcodes may be modeled as a Markovian process.

Figure 2:
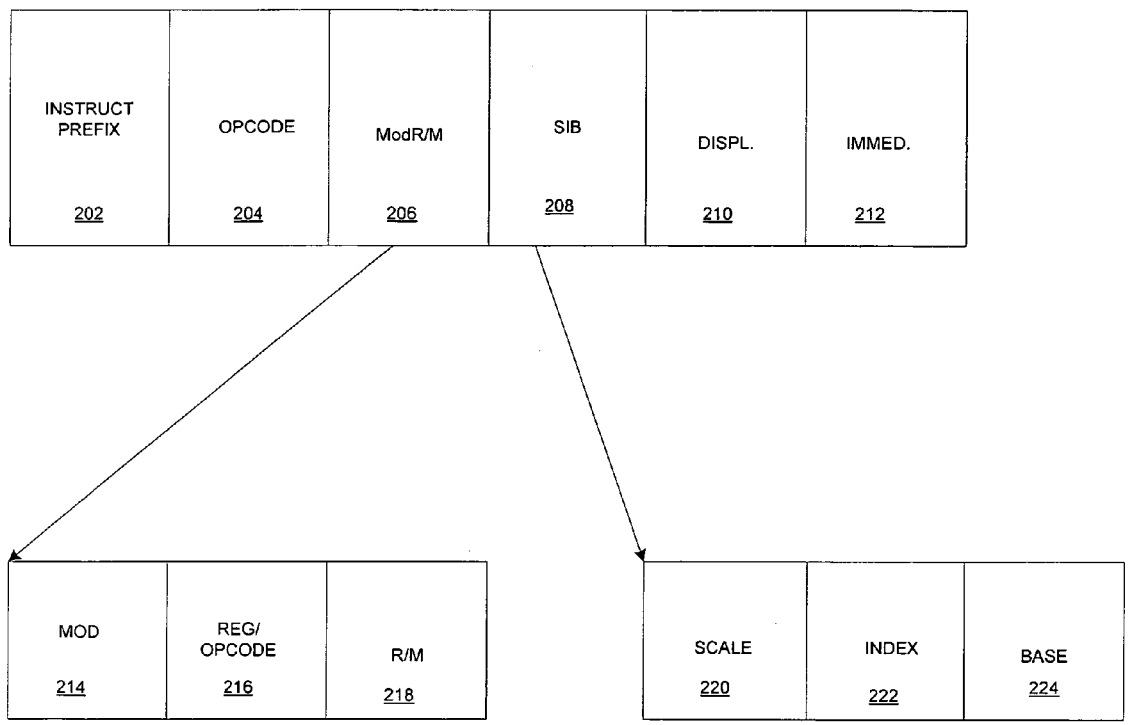
FIG. 2 is a block diagram illustrating the format of an embodiment of an instruction.

FIG. 2 is a block diagram illustrating the format of an embodiment of an instruction. The embodiment shown is an Intel® Architecture (IA)-32 instruction 200 for the IA-32 instruction set. IA-32 instruction encodings described in the IA-32 Intel Architecture Software Developer's manual are subsets of the format shown in FIG. 2. Instructions include one or more types of symbols. In the IA-32 instruction set, the types of symbols include optional instruction prefixes 202 (in any order), primary opcode bytes 204 (up to three bytes), an addressing form specifier (if required) that includes the ModR/M byte 206 and sometimes the SIB (Scale-Index-Base) byte 208, a displacement 210 (if required), and an immediate data field 212 (if required). The length of each symbol is dependent on the instruction set. For example, in the IA-32 instruction set the symbol length is 8-bits (one byte). In other instruction sets, the symbol length may be longer or shorter than 8-bits. The information for separation of an instruction into above different parts is instruction set specific and may be provided to both the compression and decompression process.

An embodiment will be described for the IA-32 instruction set. However, the invention is not limited to the IA-32 instruction set. This invention is applicable to any instruction set. The invention is also not limited to instruction sets, it is applicable to any input stream that has some correlations similar with inter-instruction and intra-instruction correlations.

Many instructions that refer to an operand in memory have an addressing-form specifier (ModR/M) byte 206 following the primary opcode. The ModR/M byte includes a mod field 214, a register/opcode field 216 and a register/mode (r/m) field 218. The mod field 214 is typically combined with the r/m field 218 to specify registers and addressing modes. The reg/opcode field 216 specifies either a register number or opcode information. The r/m field 218 can specify a register as an operand or it can be combined with the mod field 214 to encode an addressing mode.

The SIB byte 208 is a second addressing form specifier byte that includes a scale field 220, an index field 222 and a base field 224. The scale field 228 specifies the scale factor. The index field 222 specifies the register number of the index number and the base field 224 specifies the register number of the base register. Thus, an instruction in the instruction set can be considered a structure, that is, a collection of elements. In one embodiment the length of a particular instruction may be fixed but different instructions may have a different number of elements, that is, the length of instructions in the instruction set may be variable. In an alternate embodiment, the length of instructions in the instruction set may be fixed.

There exist some typical sequences of instructions in executable code. Thus, there is a strong inter-instruction correlation in executable code. For example, in an IA-32 executable program, the first two assembly instructions of a function are usually a push instruction (PUSH ebp) to save the current local stack frame pointed to by ebp followed by a mov instruction (MOV ebp, esp) to move the pointer to the new local stack frame to ebp. The binary code represented in base 16 (hexadecimal numbers indicated by prefix '0x') assigned to the PUSH ebp instruction is "0x55" and the binary code assigned to the MOV ebp, esp instruction is "0x8B 0xEC". Thus, the sequence of symbols is "0x0x8B 0xEC". Also, the instruction following a compare instruction "CMP  " is usually in the "JMP" instruction class, for example, jump on equality (JE), or jump on non-equality (JN).

FIG. 3 illustrates examples of three sets of two consecutive instructions with the first instruction in each set being a MOV instruction having an opcode 0x8B. Both the assembly language instruction and binary codes represented in base 16 corresponding to each instruction are shown. The generic assembly language mov instruction takes the form "mov destination, source" and moves a value from a source to a destination making a copy of the source and storing this value in the destination. The contents of the source are not affected and the previous contents of the destination are overwritten.

The source can be an immediate value, a general purpose register, a segment register or a memory location. The destination can be a general purpose register, a segment register or a memory location. Both the source and the destination are typically the same size, for example, a byte (8-bits), a word (16-bits) or a double-word (32-bits). All mov instructions have the same mnemonic (mov), that is, a reserved name for a class of instruction opcodes which have a similar function. In the example shown in FIG. 2 there are two move instructions with mnemonic "mov" that have different opcodes, 0x8B and 0x89. The mov instruction with opcode 0x8B (with bit 1 in the opcode set to '1', where bit 1 indicates the direction of transfer) moves data into memory and the move instruction with opcode 0x89 (with bit 1 in the opcode set to '0') moves data into a register.

In the first set of two consecutive instructions 300, the mov instruction with opcode of 0x8B is followed by a call instruction with opcode 0xe8. In the second and third set of two consecutive instructions 302, 304, the mov instruction with opcode of 0x8B is followed by another mov instruction with opcode 0x89.

Figure 4:
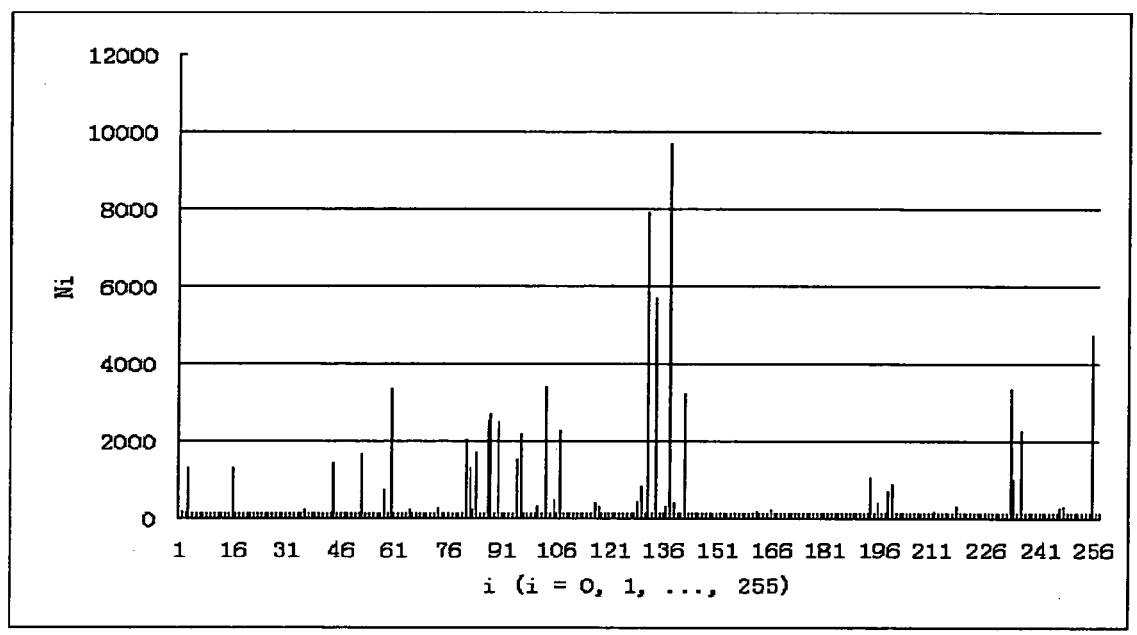
FIG. 4 is a histogram illustrating the distribution of opcodes in instructions that immediately follow opcode 0x8B in the executable file "acrord32.exe"

The executable code "acrord32.exe is typically used to compare compression algorithms. FIG. 4 is a histogram illustrating the distribution of the values (0-255) of the opcodes in instructions that immediately follow instructions with opcode 0x8B in the executable file "acrord32.exe The n-th order conditional entropy is the average number of bits to transmit the opcode knowing the n-1 preceding opcodes. The highly biased histogram clearly demonstrates the low conditional entropy of the opcode sequence, that is, the average number of bits needed to transmit the opcode that follows opcode 0x8B. For example, the first-order conditional entropy for acrord32.exe is as low as 3.498 bits.

Precisely because of the above observation on the strong inter-instruction correlation, prior art techniques for compressing executable code separate the opcodes (commands) from the rest of the executable code stream, and then compress them independently.

However, this approach destroys some strong intra-instruction correlations. Many instructions that refer to an operand in memory have an addressing form specifier (ModR/M byte) following the opcode. FIG. 5 illustrates examples of mov instructions having opcode 0x8B followed by a ModR/M byte. Both the assembly language instruction and binary codes represented in base 16 corresponding to each instruction are shown.

In the example shown in FIG. 5, the ModR/M of instruction 500 is "0xEC"; that is, the mod field 214 is '11b', the R/M field 218 is "000b" and the reg field 216 is '001b'. The ModR/M for instructions 502, 504 is "0x35", that is, the mod field 214 is '00b', the R/M field 218 is "110b" and the reg field 214 is '101b'.

Figure 6:
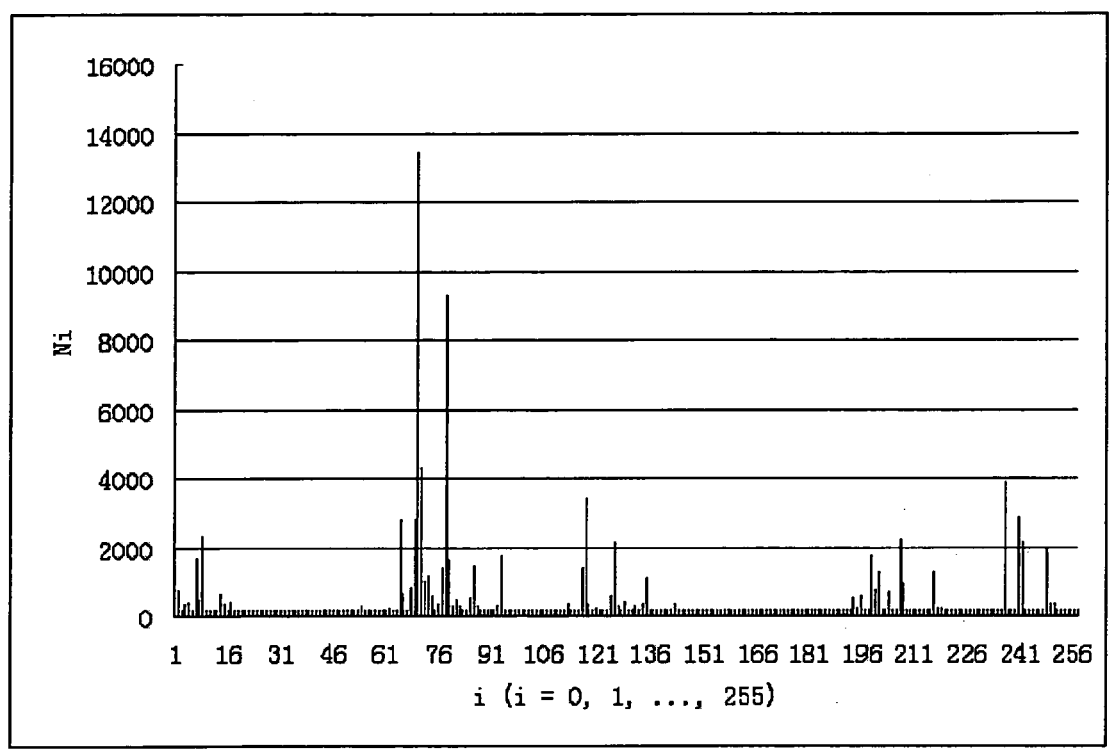
FIG. 6 is a histogram illustrating the distribution of the ModR/M byte following opcode 0x8B in the executable file "acrord32.exe"

FIG. 6 is a histogram illustrating the distribution of the values (0-255) of the ModR/M byte following opcode 0x8B in the executable file (program) "acrord32.exe". The distribution of the Mod R/M values can be seen to be highly skewed. This reveals a strong correlation between the addressing mode and the opcode. In this example the conditional entropy of the ModR/M byte following opcode 0x8B is only 3.906 bits. Thus, compressing the opcodes independently of the rest of executable program does not remove the statistical redundancy hidden in the dependency of the addressing mode on the associated opcode. Significant improvement in compression performance may be obtained by conditioning the entropy coding of the addressing mode on the associated opcode.

In the following description, $X_1 X_2 \ldots X_N$ is the instruction sequence of an executable program to be compressed, $Y_1 Y_2 \ldots Y_J$ is the opcode subsequence of instruction sequence $X_1 X_2 \ldots X_N$, where $Y_j = X_n$, $n = 1 + \Sigma_{1 \le i < j} L_i$, $L_i$ is the length of the i-th instruction. The length unit is a byte for the IA-32 instruction set.

FIG. 7 illustrates an opcode subsequence in a sequence of instructions in an executable program. The sequence of instructions starts with byte $X_1$ and ends with the last byte of the nth instruction, that is, byte $X_{i\{N\}}$. Four instructions in the sequence of instructions are shown. The first and second instructions are consecutive instructions. The third and fourth instructions are nonconsecutive instructions, with the third instruction being the kth instruction in the sequence of instructions and the fourth instruction being the nth instruction. The opcode subsequence includes the opcode from each of the instructions, that is, $X_1, X_{i+1}, \ldots X_{i\{k\}+1}, \ldots X_{i\{n\}+1}$ As is known to those skilled in the art, a Markov chain is a usually discrete stochastic process. A stochastic process is a process having a random probability distribution or pattern that can be analyzed statistically but not predicted precisely. For example, in a first order Markov chain the probabilities of occurrence of various future states depend only on the present state of the system or on the immediately preceding state and not on the path by which the present state was achieved. For executable code, the order of the Markov process may be greater than one and Markov models of any order may be used. For example, in an embodiment, models up to the third order may be used, that is, $X_i$ depends on $X\{i-1\}$, $X\{i-2\}$, and $X\{i-3\}$.

In an embodiment of the invention, one Markov chain may be used to provide inter-instruction correlations and another Markov chain may be used to provide intra-instruction correlations. For example, in the entropy coding of instruction sequence $X_i$ driven by a probability estimate $P(X_i|S(X_{i-1}X_{i-2} \ldots X_{i-t}))$, a conditioning state $S(X_{i-1}X_{i-2} \ldots X_{i-t})$ is a suitable subsequence of $X_{i-1}X_{i-2} \ldots X_{i-t}$. This subsequence may be an opcode subsequence for inter-instruction correlations or a subsequence other than the opcode subsequence for intra-instruction correlations. Thus, the conditioning state may allow the exclusion of one or more statistically irrelevant symbols in the prefix of $X_i$ from the context model, avoiding context dilution. Therefore, the probability estimate may exclude statistically irrelevant symbols from the model.

FIG. 8 illustrates an example of a sequence of instructions in executable code (program) that include statistically irrelevant symbols. The irrelevant symbols in the prefix of opcode $Y_j$ are mostly the operands in previous instructions. For example as shown in FIG. 8, the operand 0x08 in the third instruction "0x89 0x45 0x08" has no relationship with the opcode 0x85 in last instruction "0x85 0xC0" Thus, the context for the address mode symbol 0xC0 in the last instruction is '0x8D 0x4D 0x50, 0x89 0x45 0x85' The symbols "0x8D 0x4D" are from the first instruction in the sequence of instructions. The symbols '0x89 0x45' are from the third instruction and the symbol '0x85' is the opcode in the last instruction. The symbols 0x10 from the first instruction and 0x08 from the third instruction are statistically irrelevant to symbol 0xC0 and are thus excluded from the probability estimate.

The above examples of subsequences are Markov chains by both inter-instruction and intra-instruction correlations. Thus there may be multiple Markov chains that are used for entropy coding.

In one embodiment, a length of a symbol in the input instruction stream is one byte and the instruction stream is encoded byte by byte. If the given byte (symbol) is the opcode $Y_j$ of some instruction, the entropy coder is driven with the conditional probability under the context of opcodes of previous instructions (i.e., $Y_{j-1}Y_{j-2} \ldots Y_{j-t}$). Then that conditional probability $P(Y_j|Y_{j-1}Y_{j-2} \ldots Y_{j-t})$ is updated using the value of $Y_j$. If the given byte is not an opcode, that is, $X_i$, the entropy coder is driven with the conditional probability $P(X_i|S(X_{i-1}X_{i-2} \ldots X_{i-t}))$. The Markov chain (sequence) $S(X_{i-1}X_{i-2} \ldots X_{i-t})$ could be different for a different instruction set. From previous analysis of intra-instruction correlations, given the addressing mode byte, in one embodiment the Markov chain (sequence) may include the preceding opcode $Y_j$, the previous addressing mode $X_{i-L_{j-1}}$, and the previous opcode $Y_{j-1}$. After encoding of $X_i$, that context model $P(X_i|S(X_{i-1}X_{i-2} \ldots X_{i-t}))$ is updated based on the value of $X_i$. For example, the Markov chain for the last instruction in the sequence of instructions shown in FIG. 8 may include the preceding opcode 0x89 for the previous instruction (the third instruction in the sequence of four instructions), the previous addressing mode 0x45 (for the third instruction) and the previous opcode 0x50 (for the second instruction). An example of a Markov chain is shown in FIG. 8.

Figure 9:
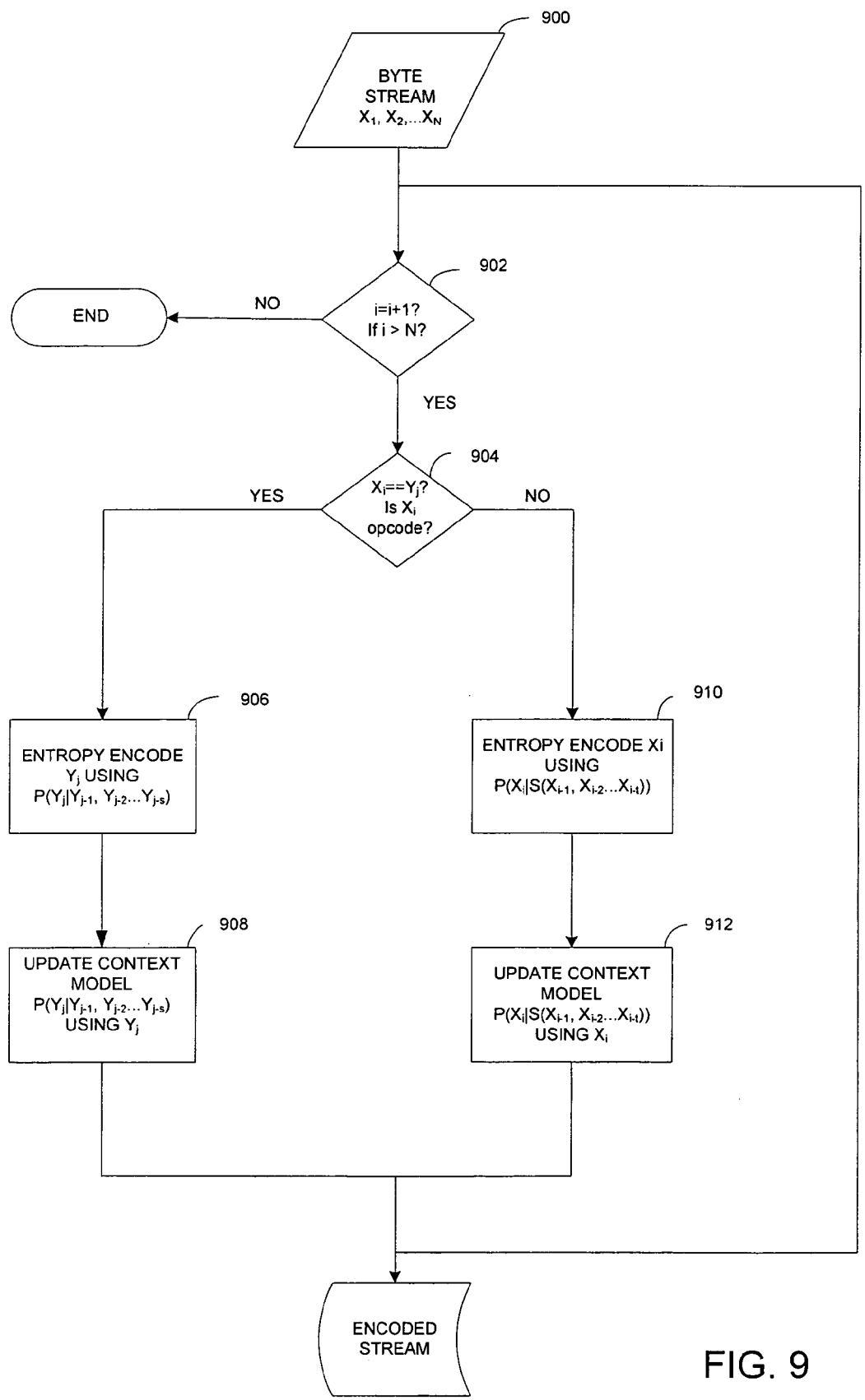
FIG. 9 is a flow diagram of an embodiment of a method of compressing executable code according to the principles of the present invention.

FIG. 9 is a flow diagram of an embodiment of a compression algorithm according to the principles of the present invention. The method of estimating probability of a symbol in a sequence of symbols may be implemented in the model 104 shown in FIG. 1. The estimated probability provided by the model 104 may be used by the coder 102 which may be an entropy coder to encode the sequence of symbols.

To simplify the description, an embodiment with two-track Markov chains is described. The Markov chains are represented by the two separate branches in the flow diagram. However, the invention is not limited to two Markov chains, there could be more than two separate branches with each branch corresponding to a different Markov chain.

Referring to FIG. 9, at block 900 an input stream of N bytes corresponding to instructions for executable code are received in a byte stream, with each byte corresponding to a symbol in the stream of bytes.

At block 902, the number of bytes processed in the input stream of bytes (i) is incremented and compared with the total number of bytes in the stream of bytes (N) to determine if the last byte has been reached. If so, processing of the input stream of bytes is complete. If not, processing continues with block 904.

At block 904, if the byte (symbol) is an opcode of an instruction, processing continues with block 906. If not, processing continues with block 910. The information to determine the type of symbol is specified implicitly in the instruction set. In the IA32 instruction set, this information is composed of several instruction lookup maps, which are used by one embodiment of the compression and decompression algorithms.

At block 906, the byte (symbol) is encoded by the coder 102 (FIG. 1) using the conditional probability provided by the model 104 (FIG. 1) under the context of opcodes of previous instructions based on the model. The model 104 computes the conditional probability of the symbol according to the Markov chain, and hands the probability over to the coder 102. Then the coder generates output bits that are output in the encoded stream. As discussed previously, the coder may be an entropy coder. Processing continues with block 908.

At block 908, the context model is updated using the current opcode. The encoded opcode is placed in the encoded stream 914 and processing continues with block 902 to continue the process for compressing the input stream.

At block 910, the non-opcode byte is encoded using the conditional probability of a subsequence other than the opcode subsequence for intra-instruction correlations based on the model. Processing continues with block 912.

At block 912, the context model for the non-opcode subsequence is updated based on the current byte (symbol). The encoded byte is placed in the encoded stream 914 and processing continues with block 902 to continue the process of compressing the input stream.

Figure 10:
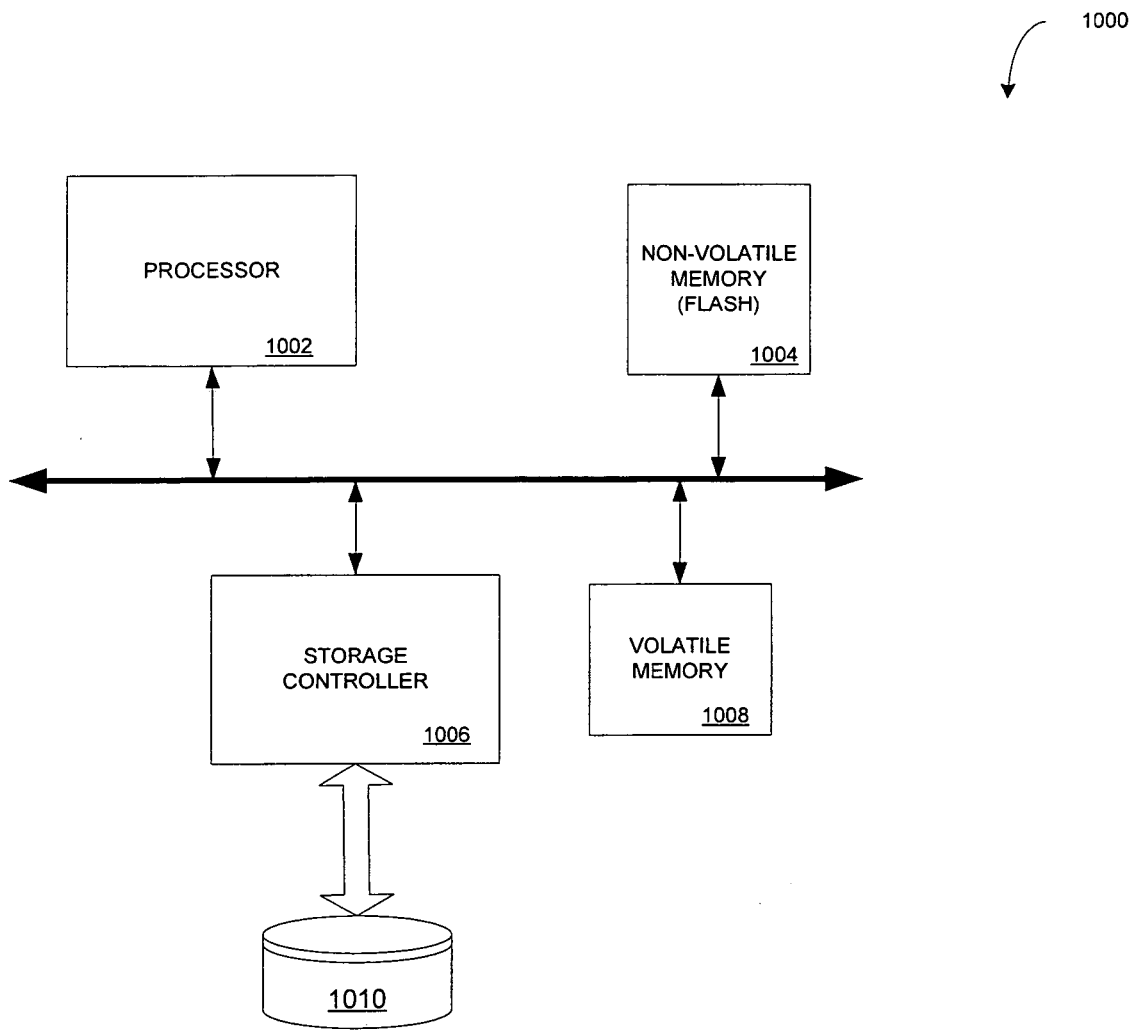
FIG. 10 is an embodiment of a system for compressing executable code according to the principles of the present invention.

FIG. 10 is a block diagram of a system 1000 which compresses a stream of program instructions based on estimated probability according to an embodiment of the present invention. The system 1000 includes a processor (CPU) 1002, storage controller 1006, non-volatile memory 1004 such as flash memory and volatile memory 1008. The storage controller 1006 controls access to a storage device 1010 which may be a disk drive. Executable code stored in memory 1008 or the storage device 1010 may be compressed using the compression process described in conjunction with FIG. 10. The compressed executable code may be stored in the non-volatile memory 1004 or the storage device 1010. A decoder for decoding the stream encoded using the method discussed in conjunction with FIG. 9 may be stored in non-volatile memory 1004 or the storage device 1010.

In one embodiment, executable code is encoded sequentially into a single code stream using a multi-track Markov model to drive an entropy coder. The process for decompressing the compressed executable program is a similar process to the compression process which has been described in conjunction with FIG. 9. Only the codes corresponding to the symbols are transmitted to a decoder. The decoder distinguishes opcodes $Y_j$ from operands $X_i$ by parsing the instruction sequence using the syntax of the machine language for the instruction set. For example, the syntax of the IA-32 instruction set is described in the IA-32 Intel Architecture Software Developer's Manual available from Intel Corporation. Although the embodiments described herein use the IA-32 instruction set, the method of jointly modeling both inter-instruction and intra-instruction correlations can be applied to other instructions sets including instruction sets for a Reduced Instruction Set Computer (RISC).

Figure 11:
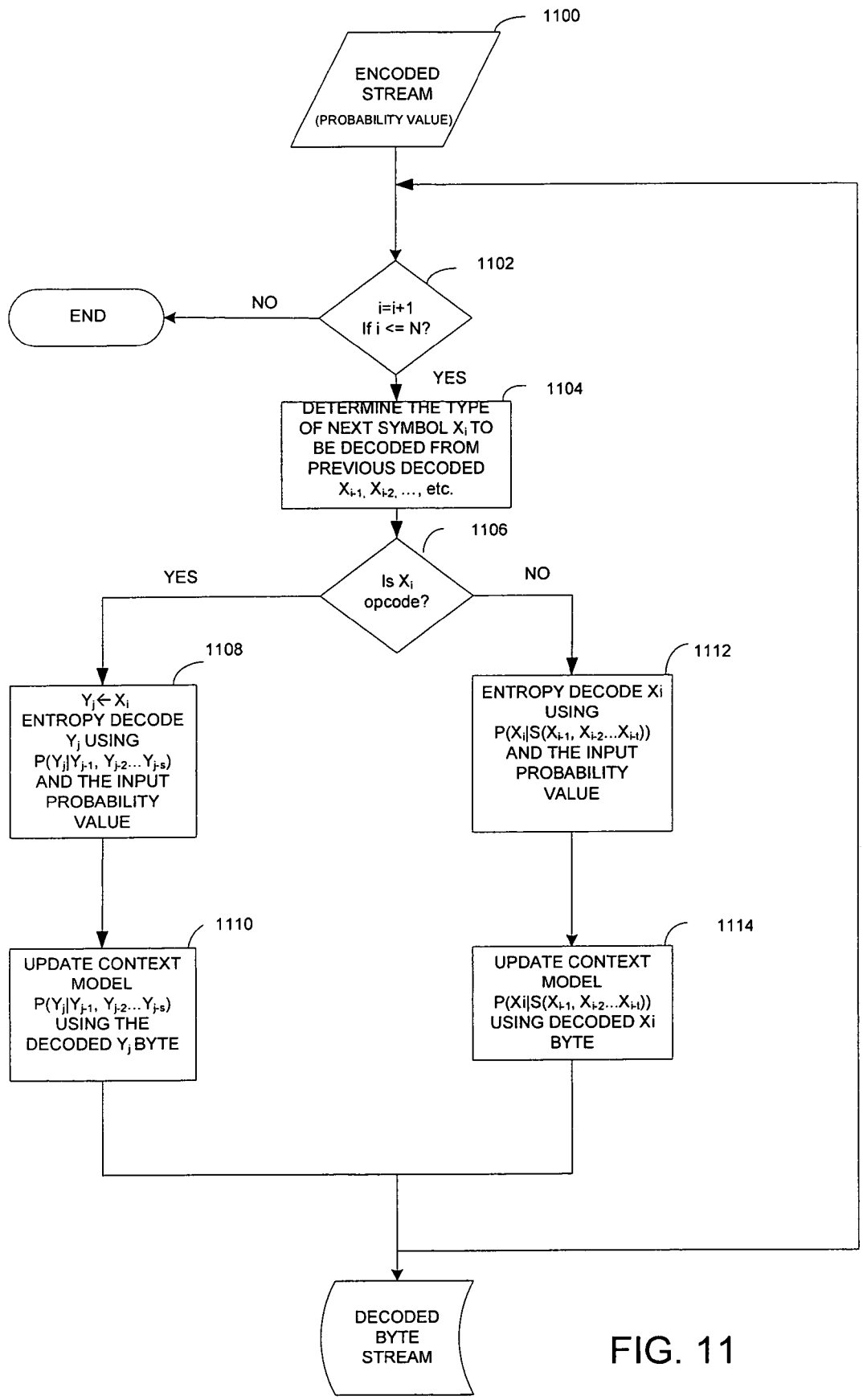
FIG. 11 is a flow diagram of an embodiment of a decompression algorithm for decoding the stream encoded using the method discussed in conjunction with FIG. 9. Although the following Detailed Description will proceed with reference being made to illustrative embodiments of the claimed subject matter, many alternatives, modifications, and variations thereof will be apparent to those skilled in the art. Accordingly, it is intended that the claimed subject matter be viewed broadly, and be defined only as set forth in the accompanying claims.

FIG. 11 is a flow diagram of an embodiment of a decompression algorithm for decoding the stream encoded using the method discussed in conjunction with FIG. 9

At block 1100 an encoded stream (a probability value) corresponding to instructions for N symbols in executable code is received. Processing continues with block 1102.

At block 1102, the number of symbols (i) that have been decoded from the encoded stream is incremented and compared with the total number of symbols to be decoded from the encoded stream to determine if the last symbol has been decoded. If so, processing of the encoded stream is complete. If not, processing continues with block 1104.

At block 1104, the type of next symbol to be decoded is determined based on the previous decoded symbols, and the instruction set specific lookup information. Processing continues with block 1106.

At block 1106, if the next symbol is an opcode, processing continues with block 1108. If not, processing continues with block 1112.

At block 1108, the byte (symbol) is decoded by the decoder using the conditional probability and the input probability value. Processing continues with block 1110.

At block 1110, the context model is updated using the decoded opcode. The decoded opcode is placed in the decoded byte stream and processing continues with block 1102 to continue the process to decompress the encoded stream.

At block 1112, the next symbol to be decoded is not an opcode and is decoded using the conditional probability of a subsequence other than the opcode subsequence for intra-instruction correlations and the input probability. Processing continues with block 1114.

At block 1114, the context model for the non-opcode subsequence is updated based on the decoded byte (symbol). The decoded byte is placed in the decoded byte stream and processing continues with block 1102 to continue the process of decompressing the encoded stream.

The method of compressing an executable program may be used to compress an executable program so that it may be stored in devices with limited memory and/or communications bandwidth, and real-time compression/decompression is required. For example, Extensible Firmware Interface (EFI) drivers can be compressed so that they can be stored in a limited size Flash memory. In one embodiment, a 2 Megabyte executable program may be compressed to about 316 Kilobytes (K) allowing the compressed executable program to be stored in a 320 K Flash memory. The compressed file is smaller than the 366 K achieved by the Lempel-Ziv-Markov chain-Algorithm (LZMA)

The compression method results in a compression ratio of 69.53% when compressing the file acroad32.exe. This compression ratio is better than the compression ratio of 55.07% achieved by WinZip for compressing the same file. WinZip is a commercial file archiver developed by WinZip Computing.

Also, compression of an executable program may be used in a wireless environment in order to reduce network traffic and cost of transmission allowing support of more end-users by network service providers.

In an alternate embodiment, the method of compressing an executable program may be used to compress web applications such as Microsoft's ActiveX for download via the Internet which may be decompressed in real-time prior to execution. In yet another embodiment, the method of compression may be used for real-time scanning, for example, real-time scanning for a virus in a compressed file.

An embodiment of the invention can also be applied to compress any input stream that has similar correlations with intra-instruction and inter-instruction-correlations. The input instruction stream is a tangled sequence that includes various subsequences, for example, the opcode subsequences, the instruction subsequence, and the addressing mode subsequences, and so on. The intra-instruction and inter-instruction correlations are also the correlations among or within these subsequences. There are other sequences similar to the instruction sequence, with correlations mingled in the tangled sequence. This invention is applicable to these tangled sequences, by modeling the tangled sequence into multiple Markov chains according to the correlations. The probability of each symbol in the input tangled sequence is estimated according to the contexts in the Markov chain that the symbol belongs to. The determination of the symbol corresponding Markov chain is application specific. In the embodiment of instruction stream compression, the determination is based on the type of the symbol within the instruction.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

It will be apparent to those of ordinary skill in the art that methods involved in embodiments of the present invention may be embodied in a computer program product that includes a computer usable medium. For example, such a computer usable medium may consist of a read only memory device, such as a CD ROM disk or conventional ROM devices, or a computer diskette, having a computer readable program code stored thereon.

While the invention has been described in terms of several embodiments, those skilled in the art will recognize that the invention is not limited to the embodiments described, but can be practiced with modification and alteration within the spirit and scope of the appended claims. The description is thus to be regarded as illustrative instead of limiting.

What is claimed is:

1. A method comprising:
   modeling an input tangled sequence of symbols into a plurality of Markov chains; and
   encoding a symbol with a context model in the Markov chain corresponding to a symbol type associated with the symbol.

2. The method of claim 1, wherein the input tangled sequence is tangled by multiple subsequences.

3. The method of claim 2, wherein modeling further comprises:
   utilizing correlations among and within the subsequences of the input tangled sequence to construct the plurality of Markov chains.

4. The method of claim 1, wherein encoding further comprises:
   estimating conditional probability of a symbol from a context model in the Markov chain corresponding to the symbol.

5. The method of claim 1, wherein one of the plurality of Markov chains provides correlations among or within subsequences based on a probability estimate.

6. The method of claim 1, wherein the input tangled sequence is an instruction stream, the instruction stream comprising a subsequence of oncodes and a subsequence of addressing modes.

7. An apparatus comprising:
   a model capable of modeling an input tangled sequence of symbols into a plurality of Markov chains and capable of encoding a symbol with a context model in a Markov chain corresponding to a symbol type associated with the symbol.

8. The apparatus of claim 7, wherein the input tangled sequence is tangled by multiple subsequences.

9. The apparatus of claim 8, wherein the model is capable of utilizing correlations among and within the subsequences of the input tangled sequence to construct the plurality of Markov chains.

10. The apparatus of claim 7, wherein the model is capable of estimating conditional probability of a symbol from a context model in the Markov chain corresponding to the symbol.

11. The apparatus of claim 7, wherein one of the plurality of Markov chains provides correlations among or within the subsequences of the input tangled sequence based on a probability estimate.

12. The apparatus of claim 7, wherein the input tangled sequence is an instruction stream, the instruction stream comprising a subsequence of opcodes and a subsequence of addressing modes.

13. An article including a machine-accessible medium having associated information, wherein the information, when accessed, results in a machine performing:
- modeling an input tangled sequence of symbols into a plurality of Markov chains and
- encoding a symbol with a context model in a Markov chain corresponding to a symbol type associated with the symbol.

14. The article of claim 13, wherein modeling further comprises:
- utilizing correlations among and within the subsequences of the input tangled sequence to construct the plurality of Markov chains.

15. The article of claim 13, wherein encoding further comprises:
- estimating conditional probability of a symbol from context model in the Markov chain corresponding to the symbol.

16. The article of claim 13, wherein one of the plurality of Markov chains provides correlations among or within the subsequences of the input tangled sequence based on a probability estimate.

17. A system comprising:
- a non-volatile memory capable of storing a compressed sequence; and
- a model coupled to the non-volatile memory, the model capable of modeling an input tangled sequence of symbols into a plurality of Markov chains and encoding a symbol with a context model in a Markov chain corresponding to a symbol type associated with the symbol to provide the compressed sequence.

18. The system of claim 17, wherein the model is capable of utilizing correlations among and within subsequences of the input tangled sequence to construct the plurality of Markov chains.

19. The system of claim 17, wherein the model is capable of estimating conditional probability of a symbol from a context model in the Markov chain corresponding to the symbol.

20. The system of claim 17, wherein one of the plurality of Markov chains provides correlations among or within the subsequences of the input tangled sequence based on a probability estimate.

21. A method comprising:
- decoding a compressed stream, the compressed stream having been compressed by modeling an input tangled sequence of symbols into a plurality of Markov chains and by encoding a symbol with a context model in the Markov chain corresponding to a symbol type associated with the symbol.

22. The method of claim 21, wherein modeling further comprises:
- utilizing correlations among and within subsequences of the input tangled sequence to construct the plurality of Markov chains.

23. The method of claim 21, wherein encoding further composes:
- estimating conditional probability of a symbol from a context model in the Markov chain corresponding to the symbol.

24. The method of claim 21, wherein one of the plurality of Markov chains provides correlations among or within subsequences based on a probability estimate.

25. An apparatus comprising:
- a decoder capable of decoding a compressed stream, the compressed stream having been compressed by a model capable of modeling an input tangled sequence of symbols into a plurality of Markov chains and capable of encoding a symbol with a context model in the Markov chain corresponding to a symbol type associated with the symbol.

26. The apparatus of claim 25, wherein the model is capable of utilizing correlations among and within subsequences of the input tangled sequence to construct the plurality of Markov chains.

27. The apparatus of claim 25, wherein the model is capable of estimating conditional probability of a symbol from a context model in the Markov chain corresponding to the symbol.

28. The apparatus of claim 25, wherein one of the plurality of Markov chains provides correlations among or within the subsequences of the input tangled sequence based on a probability estimate.

* * * * *